United States Patent
Cao et al.

(10) Patent No.: US 8,072,757 B2
(45) Date of Patent: Dec. 6, 2011

(54) HEAT DISSIPATION APPARATUS

(75) Inventors: Liang-Liang Cao, Shenzhen (CN); Yu-Hsu Lin, San Jose, CA (US); Zhi-Ping Wu, Shenzhen (CN); Yang Li, Shenzhen (CN); Lei Guo, Shenzhen (CN)

(73) Assignees: Hong Fu Jin Precision Industry (ShenZhen) Co. Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 211 days.

(21) Appl. No.: 12/479,955

(22) Filed: Jun. 8, 2009

(65) Prior Publication Data
US 2010/0134971 A1 Jun. 3, 2010

(30) Foreign Application Priority Data
Nov. 28, 2008 (CN) .......................... 2008 1 0305848

(51) Int. Cl.
*H05K 7/20* (2006.01)
*F28F 7/00* (2006.01)

(52) U.S. Cl. ..... 361/697; 361/695; 165/80.3; 415/213.1
(58) Field of Classification Search ................. None
See application file for complete search history.

(56) References Cited

U.S. PATENT DOCUMENTS

| | | | | |
|---|---|---|---|---|
| 6,141,217 A | * | 10/2000 | Nakahama et al. | 361/694 |
| 7,004,236 B2 | * | 2/2006 | Lee et al. | 165/80.3 |
| 7,221,567 B2 | * | 5/2007 | Otsuki et al. | 361/695 |
| 7,405,934 B2 | * | 7/2008 | Otsuki et al. | 361/697 |
| 7,424,906 B2 | * | 9/2008 | Bhatti et al. | 165/80.3 |
| 7,475,718 B2 | * | 1/2009 | Reyzin et al. | 165/104.33 |
| 7,484,925 B2 | * | 2/2009 | Carlson et al. | 415/79 |
| 7,753,107 B2 | * | 7/2010 | Zhou et al. | 165/80.3 |
| 2004/0234374 A1 | * | 11/2004 | Huber | 415/220 |
| 2008/0087315 A1 | * | 4/2008 | Deming et al. | 136/203 |

* cited by examiner

*Primary Examiner* — Boris Chervinsky
(74) *Attorney, Agent, or Firm* — Altis Law Group, Inc.

(57) ABSTRACT

A heat dissipation apparatus includes a heat sink configured to contact a heat source, and a fan mounted on the heat sink configured to generate airflow through the heat dissipation apparatus. The fan includes a plurality of fan blades, and a motor configured for rotating the fan. The motor is located a distance from the fan blades.

14 Claims, 2 Drawing Sheets

HEAT DISSIPATION APPARATUS

BACKGROUND

1. Technical Field

The present disclosure relates to a heat dissipation apparatus.

2. Description of Related Art

Electronic devices in computers, such as central processing units (CPUs), generate heat during normal operation, which can deteriorate their operational stability, and damage associated electronic devices if not dissipated. Thus, the heat must be removed quickly to ensure normal operation of the CPU. A typical heat dissipation apparatus includes a typical heat sink mounted on a CPU to remove heat, and a fan fixed on the heat sink to generate airflow through the heat dissipation apparatus. The typical fan includes a plurality of fan blades and a motor in the center of the fan for rotating the fan. However, the motor occupies some air intake area, lowering heat dissipation efficiency of the fan.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
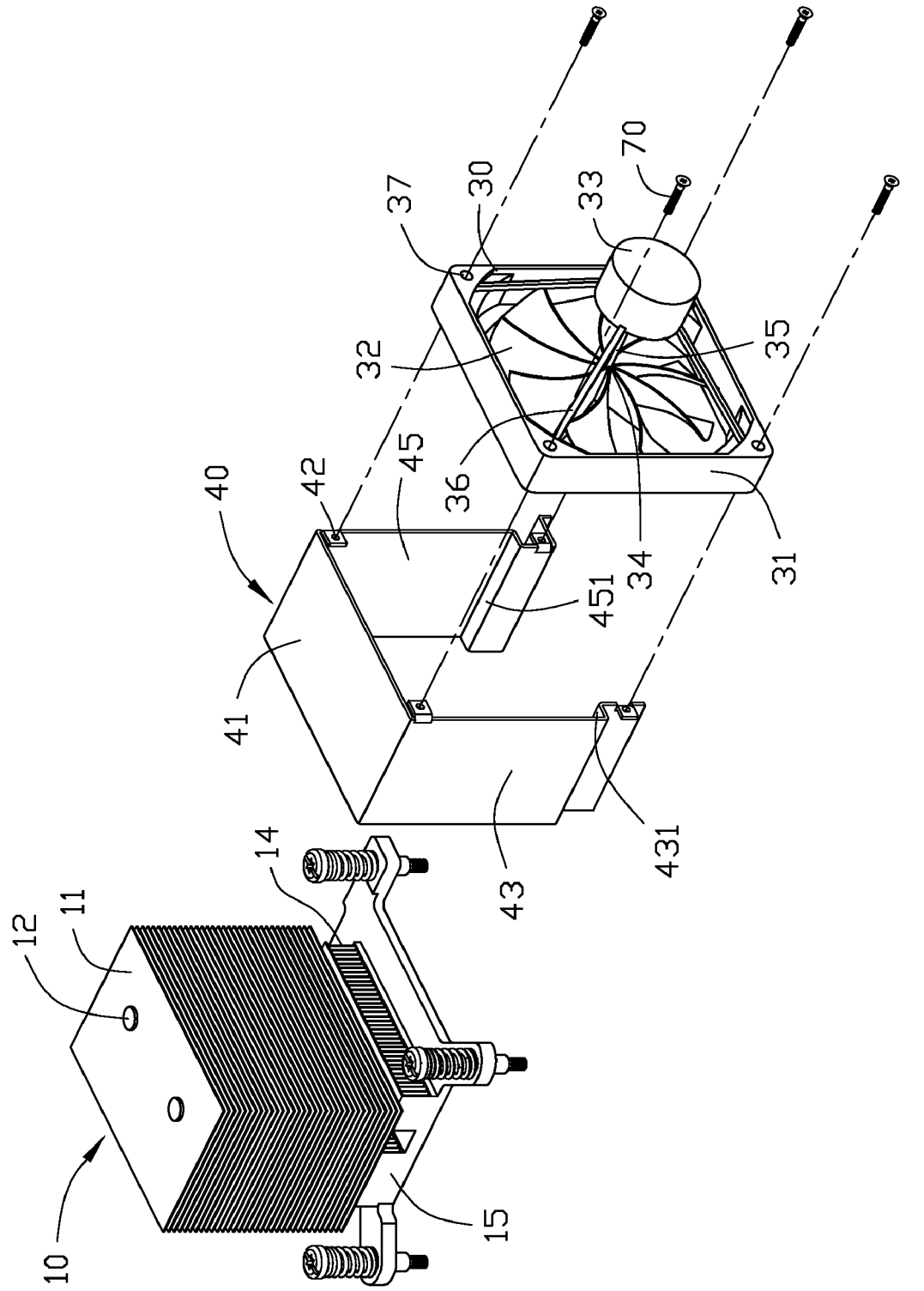
FIG. 1 is an exploded view of an embodiment of a heat dissipation apparatus.

FIG. 1 is an exploded view of an embodiment of a heat dissipation apparatus. The heat dissipation apparatus includes a heat sink 10, a fan 30, and a mounting bracket 40 for fixing the fan 30 onto the heat sink 10.

The heat sink 10 includes a base 15, and a U-shaped heat pipe 12 positioned on a top surface thereof. A plurality of parallel fins 11 is secured on the heat pipe 12 with the heat pipe 12 passing therethrough. A bottom surface of the base 15 is configured to contact a heat source, such as a central processing unit (CPU). The heat generated by the heat source is transmitted from the base 15 to the fins 11 via the heat pipe 12. A plurality of vertical conducting fins 14 is positioned on the base 15 and in contact with the heat pipe 12. The conducting fins 14 transmit heat from the bottom surface to the top surface of the base 15 and the heat pipe 12.

The mounting bracket 40 is approximately U-shaped and elastic. The mounting bracket 40 includes a top wall 41 and two sidewalls 43, 45 extending perpendicularly and downwardly from opposite edges of the top wall 41. Two support portions 431, 451 protrude toward each other from lower portions of the corresponding sidewalls 43, 45. Four fastener holes 42 are defined at four corners of the mounting bracket 40.

The fan 30 includes a fan bracket 31, a plurality of fan blades 32 located in the fan bracket 31, and a motor 33 for rotating the fan blades 32. The fan blades 32 extend from a connecting point 34 at a hub of the fan blades 32. The motor 33 is located outside of the fan bracket 31. An axle 35 extends outwards from the motor 33 to the connecting point 34 of the fan 30, and is driven by the motor 33. The connecting point 34 of the fan blades 32 is rotatably mounted on the axle 35. The motor 33 is connected to the corners of the fan 30 via four supporting ribs 36. One supporting rib 36 defines a groove, in which power, signal, and ground leads are disposed, by which the motor 33 is electrically coupled to a motherboard. Four fixing holes 37 are defined at corners of the fan bracket 31 corresponding to the fastener holes 42 of the mounting bracket 40.

Figure 2:
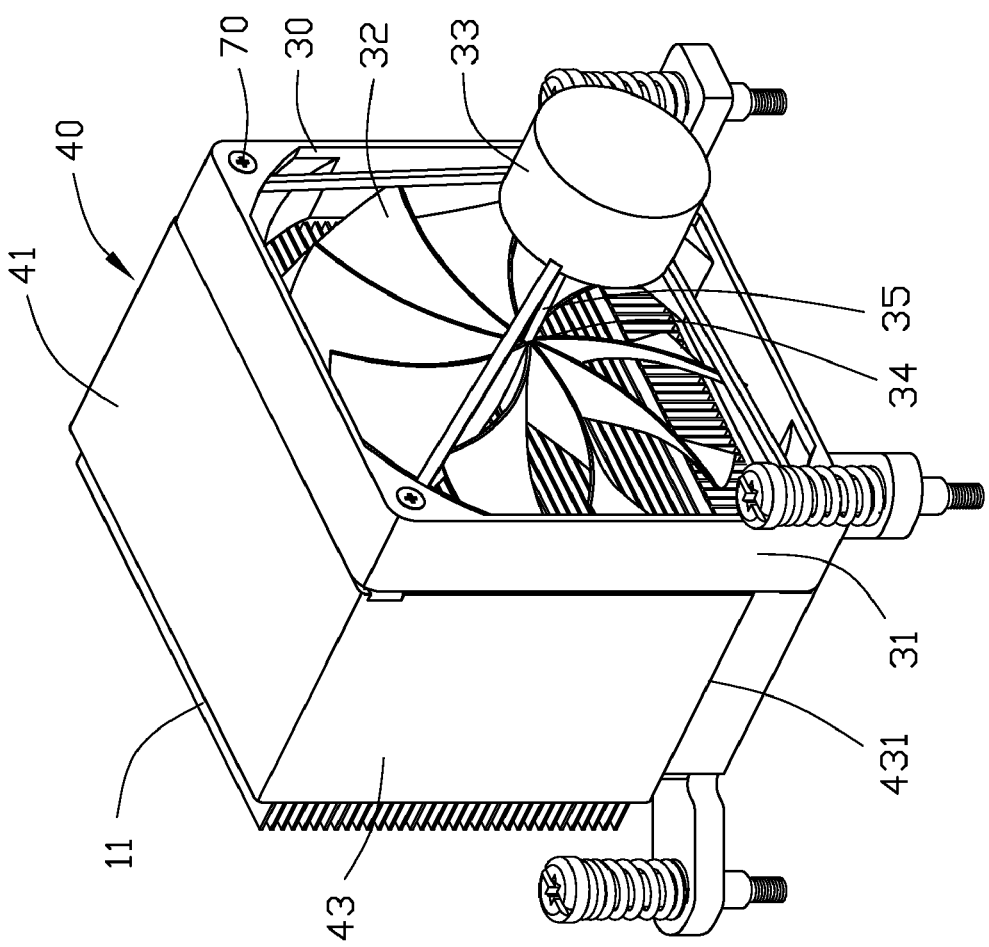
FIG. 2 is an assembled view of the heat dissipation apparatus of FIG. 1.

Referring to FIG. 2, in assembly, the sidewalls 43, 45 are pulled outward in opposite directions to receive the parallel fins 11 in a space cooperatively formed by the top wall 41, and the sidewalls 43, 45. When a topmost fin 11 of the plurality of the parallel fins 11 resists the top wall 41, the sidewalls 43, 45 are released to sandwich the parallel fins 11 therebetween. Top surfaces of the support portions 431, 451 resist a bottommost fin of the plurality of parallel fins 11, thereby fixing the mounting bracket 40 to the heat sink 10. The fan 30 is fixed onto the mounting bracket 40 by four fasteners 70 received in the fastener holes 42 through the fixing holes 37.

Because there is a space between the motor 33 and the fan blades 32, air intake for the fan is unobstructed. In one embodiment, a length of the axle 35 is 20 millimeters. A power dissipation of the heat source is 65 W. The heat sink 10 is made of aluminum and has a dimension of 94 mm×50 mm×100 mm (length×width×height). The heat pipe 12 is plated with cuprum and has a diameter of 6 mm. The fan 30 has a dimension of 92 mm×92 mm×15 mm (length×width× height), and a diameter of the motor 33 is 34 mm. A maximum air flow rate of the fan 30 is 44.49 cfm. A rated speed of the fan 30 is 2800 rpm. When the fan 30 rotates, air intake area of the fan 30 can receive airflow. A software is used for simulating the effectiveness of the fan 30. The temperature of the heat sink 10 decreases 2.2 celsius degree, and efficiency of heat dissipation is improved. The length of the axle 35 between the motor and the blades can be in the range of about 10 mm to about 25 mm. In this embodiment, 20 mm is the length for the axle 35 in consideration of efficiency and stability of the fan 30.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation apparatus comprising:
   a heat sink configured to contact a heat source, comprising:
      a base with a bottom surface contacting the heat source;
      a plurality of parallel fins positioned on the base; and
   a fan mounted on the heat sink configured to generate airflow through the heat dissipation apparatus, comprising:
      a fan bracket;
      a plurality of fan blades located in the fan bracket;
      a motor configured for rotating the fan, the motor being located outside of the fan bracket; and
      a mounting bracket for fixing the fan to the heat sink;
         wherein the mounting bracket comprises a top wall and two sidewalls extending downwardly from opposite edges of the top wall; two support portions protrude toward each other from lower portions of the corresponding sidewalls; and the plurality of parallel fins are received in a space cooperatively defined by the top wall and the sidewalls.

2. The heat dissipation apparatus of claim 1, further comprising an axle extending outwards from the motor to connect with the fan.

3. The heat dissipation apparatus of claim 2, further comprising a plurality of supporting ribs, whereby the motor is supported by the supporting ribs.

4. The heat dissipation apparatus of claim 3, wherein the motor and the supporting ribs are located on an air intake side of the fan.

5. The heat dissipation apparatus of claim 4, wherein one of the supporting ribs defines a groove, in which power, signal, and ground leads are disposed.

6. The heat dissipation apparatus of claim 1, further comprising an axle, wherein the axle has a length that is in the range of about 10 mm to about 25 mm.

7. The heat dissipation apparatus of claim 1, wherein a topmost fin of the plurality of the plurality of parallel fins resists the top wall; and the support portions resist a bottommost fin of the plurality of parallel fins to sandwich the parallel fins therebetween.

8. The heat dissipation apparatus of claim 1, further comprising a plurality of fixing holes defined on the corners of the fan bracket, a plurality of fastener holes defined on the corners of the mounting bracket, and a plurality of fasteners received in the fastener holes and the fixing holes.

9. A heat dissipation apparatus comprising:
a heat sink configured to contact a heat source, comprising:
  a base configured to contact a heat source;
  a plurality of heat sink fins parallel positioned on the base; and
a fan mounted on the heat sink configured to generate airflow through the heat dissipation apparatus, comprising:
  a plurality of fan blades;
  a motor configured for rotating the fan, the motor being located a distance away from a plane defined by the fan blades; and
  a mounting bracket for fixing the fan to the heat sink; wherein the mounting bracket comprises a top wall and two sidewalls extending downwardly from opposite edges of the top wall; two support portions protrude toward each other from lower portions of the corresponding sidewalls; and the plurality of parallel fins are received in a space cooperatively defined by the top wall and the sidewalls.

10. The heat dissipation apparatus of claim 9, further comprising an axle extending outwards from the motor to be connected with the fan.

11. The heat dissipation apparatus of claim 10, further comprising a fan bracket and a plurality of supporting ribs, the fan blades are located in the fan bracket and the motor connected to the fan bracket via the supporting ribs.

12. The heat dissipation apparatus of claim 9, further comprising a plurality of fixing holes defined on the corners of the fan bracket, a plurality of fastener holes defined on the corners of the mounting bracket, and a plurality of fasteners received in the fastener holes and the fixing holes.

13. The heat dissipation apparatus of claim 9, further comprising an axle, wherein the axle has a length that is in the range of about 10 mm to about 25 mm.

14. The heat dissipation apparatus of claim 9, wherein a topmost fin of the plurality of the plurality of parallel fins resists the top wall; and the support portions resist a bottommost fin of the plurality of parallel fins to sandwich the parallel fins therebetween.

* * * * *